(12) United States Patent
Takada et al.

(10) Patent No.: US 8,147,750 B2
(45) Date of Patent: Apr. 3, 2012

(54) GOLD ALLOY WIRE FOR BALL BONDING

(75) Inventors: Mitsuo Takada, Saga (JP); Satoshi Teshima, Saga (JP); Takeshi Kuwahara, Saga (JP)

(73) Assignee: Tanaka Denshi Kogyo KK, Tokyo (JP)

( * ) Notice: Subject to any disclaimer, the term of this patent is extended or adjusted under 35 U.S.C. 154(b) by 768 days.

(21) Appl. No.: 12/224,212

(22) PCT Filed: Jun. 23, 2008

(86) PCT No.: PCT/JP2008/061424
§ 371 (c)(1),
(2), (4) Date: Aug. 21, 2008

(87) PCT Pub. No.: WO2009/054164
PCT Pub. Date: Apr. 30, 2009

(65) Prior Publication Data
US 2010/0226816 A1    Sep. 9, 2010

(30) Foreign Application Priority Data
Oct. 24, 2007 (JP) .................. 2007-276104

(51) Int. Cl.
*C22C 5/02* (2006.01)
*B22D 3/00* (2006.01)
*B22D 5/00* (2006.01)
*H01F 1/16* (2006.01)
*H02G 3/04* (2006.01)

(52) U.S. Cl. ............ 420/507; 174/126.1; 428/544
(58) Field of Classification Search ............... 174/68.1, 174/126.1; 420/507; 428/544
See application file for complete search history.

(56) References Cited

U.S. PATENT DOCUMENTS
5,945,065 A * 8/1999 Kikuchi et al. ............... 420/507
6,492,593 B2 * 12/2002 Murai et al. ................. 174/94 R FOREIGN PATENT DOCUMENTS
JP    10-004114    1/1998
* cited by examiner

*Primary Examiner* — Jessica L Ward
*Assistant Examiner* — Alexander Polyansky
(74) *Attorney, Agent, or Firm* — Wenderoth, Lind & Ponack, L.L.P.

(57) ABSTRACT

There is provided a gold alloy wire for a ball bonding. The gold alloy consists of 10 to 50 ppm by mass of magnesium (Mg); 5 to 20 ppm by mass of europium (Eu); 2 to 9 ppm by mass of calcium (Ca); and a remaining portion being gold (Au) having a purity of a minimum of 99.998% by mass. In the gold alloy wire for a ball bonding, an addition amount of calcium (Ca) is a maximum of half that of europium (Eu).

8 Claims, 6 Drawing Sheets

GOLD ALLOY WIRE FOR BALL BONDING

FIELD OF THE INVENTION

The present invention relates to a gold alloy wire for a ball bonding, and relates to a gold alloy wire excellent in fracture load of a tension test when a wire elongation percentage is 4% (hereinafter, written as a wire strength); having less contamination and shrinkage holes generated by an oxide on an entire surface of a molten ball when the molten ball is formed; excellent in stability of a shape of a ball which is formed by melting (hereinafter, written as a molten-ball formability); excellent in roundness of a compression ball shape when the ball formed by melting is ball bonded (hereinafter, written as roundness of a compression ball shape); and excellent in stitch bondability for bonding a wire by pressing it against a frame, a substrate, etc., by a capillary (hereinafter, written as a stitch bondability).

DESCRIPTION OF THE RELATED ART

When connecting an electrode on an IC chip and an external wire, wire boding methods for interconnecting via a wire are known. Out of these methods, by a method for bonding an aluminum electrode on the IC chip and the wire, a thermosonic bonding and an ultrasonic bonding play a major part.

Herein, the thermosonic bonding is usually performed by a ball bond bonding method. A bonding method by the ball bond bonding method is described by reproducing figures shown in Patent Document 1 in FIG. 1.

As shown in FIG. 1A, a wire 2 is inserted into a capillary 1, a tip end of the wire 2 is arranged to face an electric torch 3, and in this state, a discharge is generated between the wire 2 and the electric torch 3, thereby heating and melting the tip end of the wire 2, whereby a ball 4 is formed.

Subsequently, as shown in FIG. 1B, the capillary 1 is descended to press and bond the ball 4 onto an aluminum electrode 5 on an IC chip 6. At this time, although not shown, an ultrasonic oscillation is added through the capillary 1, and the IC chip 6 is heated by a heater block. Thereby, the ball 4 is thermally compressed to become a compression ball 4'.

Thereafter, as shown in FIG. 1C, the capillary 1, while drawing a predetermined trajectory, moves onto an external wire 8 and descends thereon. At this time, although not shown, the ultrasonic oscillation is added through the capillary 1, and the external wire 8 is heated by the heater block. Thus, a lateral side of the wire 2 is thermally compressed. Bonding by the thermal compression is called a stitch bonding.

Subsequently, as shown in FIG. 1D, a clamper 7 is raised while the wire 2 is being clamped, and thereby, the wire 2 is cut. Thus, the wiring is completed.

In the general gold alloy wire for a ball bonding, the wire strength, the molten-ball formability, the roundness of a compression ball shape, and the stitch bondability need to withstand practical use. An elongation percentage of the general gold alloy wire for a ball bonding is set to 2 to 6%. However, when a loop formability is taken into consideration, the elongation percentage desirably is a minimum of 3%, and in particular, desirably is 4%.

For a gold alloy wire for bonding a wedge, in the Patent Document 1, there is developed a gold alloy wire in which 1 to 100 ppm by mass of calcium (Ca) is added to high-purity gold, the gold alloy wire of which a gold purity is a minimum of 99.9% by mass, a tension strength is a minimum of 33.0 kg/mm$^2$, and an elongation percentage is 1 to 3%. This gold alloy wire is excellent in high-temperature bonding strength, suitable for high-density wiring of the IC chip, and also well bonded by the wedge bonding.

However, when this gold alloy wire is used as a ball bonding wire, the roundness of a compression ball shape is deteriorated, and thus, a stabled ball bonding cannot be performed. Further, as the elongation percentage is low, a loop shape cannot be easily drawn. Thus, the loop formability is deteriorated. As a result, the application is limited to the wedge bonding. This limits a range within which the gold alloy wire is used for a semiconductor device.

On the other hand, in Patent Document 2, an example 13 discloses a bonding wire consisting of: 29 ppm by mass of magnesium (Mg); 10 ppm by mass of calcium (Ca); 8 ppm by mass of europium (Eu); and a remaining portion being high-purity gold of which the purity is 99.999%. The bonding wire is characterized in that a wire breaking at the time of a semiconductor assembly is not easily generated and an assembly yield of the semiconductor device does not decrease.

However, although this bonding wire is excellent in wire strength, as is apparent in a comparative example 2 described later, the roundness of a compression ball shape is poor, and it cannot be said that the stitch bondability is satisfactory.

Patent Document 1: Japanese Patent No. 3657087

SUMMARY OF THE INVENTION

Problem to be Solved by the Invention

In view of the above-described circumstances, an object of the present invention is to provide a gold alloy wire which is excellent in molten-ball formability, stitch bondability, and wire strength, similarly to the prior art, but which is further excellent in roundness of a compression ball shape and compatible with a high-density wiring of a semiconductor device.

Means for Solving the Problem

Through extensive studies on a gold alloy wire excellent in wire strength, the present inventor newly found that when a trace amount of additional calcium (Ca) was a maximum of half that of europium (Eu), a gold alloy consisting of an additional trace element system in a predetermined range of Ca—Mg—Eu, or a gold alloy consisting of an additional element system in a trace amount of Ca—Mg—Eu—Sn exhibited an effect excellent in wire strength, molten-ball formability, roundness of a compression ball shape, and stitch bondability, and thus, reached completion of the present invention.

Specifically, according to the present invention, is provided a gold alloy wire for a ball bonding, the gold alloy consisting of: 10 to 50 ppm by mass of magnesium (Mg); 5 to 20 ppm by mass of europium (Eu); 2 to 9 ppm by mass of calcium (Ca); and a remaining portion being gold (Au) having a purity of a minimum of 99.998% by mass, wherein an additional amount of calcium (Ca) is a maximum of half that of europium (Eu).

According to the present invention, is provided a gold alloy wire for a ball bonding, the gold alloy consisting of: 10 to 50 ppm by mass of magnesium (Mg); 1 to 30 ppm by mass of tin (Sn); 5 to 20 ppm by mass of europium (Eu); 2 to 9 ppm by mass of calcium (Ca); and a remaining portion being gold (Au) having a purity of a minimum of 99.998% by mass, wherein an amount of additional calcium (Ca) is a maximum of half that of europium (Eu).

According to the present invention, is provided a gold alloy wire for a ball bonding, the gold alloy consisting of: 10 to 50 ppm by mass of magnesium (Mg); 5 to 20 ppm by mass of europium (Eu); 2 to 9 ppm by mass of calcium (Ca); and a remaining portion being gold (Au) having a purity of a minimum of 99.998% by mass, wherein an amount of additional calcium (Ca) is a maximum of half that of europium (Eu), and a total amount of additional trace europium (Eu) and calcium (Ca) is that of a maximum of 25 ppm by mass.

According to the present invention, is provided a gold alloy wire for a ball bonding, the gold alloy consisting of: 10 to 50 ppm by mass of magnesium (Mg); 1 to 30 ppm by mass of tin (Sn); 5 to 20 ppm by mass of europium (Eu); 2 to 9 ppm by mass of calcium (Ca); and a remaining portion being gold (Au) having a purity of a minimum of 99.998% by mass, wherein an amount of additional calcium (Ca) is a maximum of half that of europium (Eu), and a total amount of additional trace europium (Eu) and calcium (Ca) is that of a maximum of 25 ppm by mass.

In a preferred mode, an amount of additional trace magnesium (Mg) is added by 15 to 40 ppm by mass.

Effects of the Invention

According to the gold alloy wire for a ball bonding according to the present invention, a gold alloy consisting of an additional element system in a trace amount in a predetermined range of Ca—Mg—Eu, or a gold alloy consisting of an additional element system in a trace amount of Ca—Mg—Eu—Sn exhibits an effect excellent in wire strength, stitch bondability, roundness of a compression ball shape, and molten-ball formability, and is effective in improving a productivity of a semiconductor device. In particular, in mounting a QFP or QFN package, and so on, in which a stitch bonding is said to be difficult because fixing a member in a stitch bonding portion is difficult, a stable bonding is possible, and thus, it is effective in improving a productivity of a semiconductor device.

DESCRIPTION OF THE REFERENCE NUMERALS

Figure 1A:
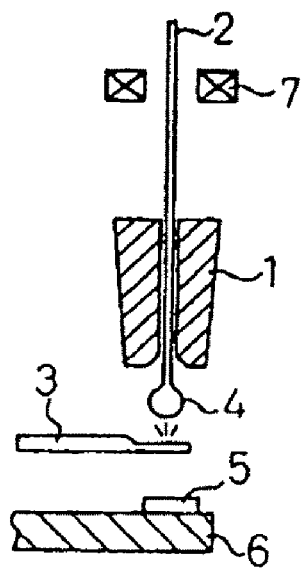
FIGS. 1A, 1B, 1C, and 1D are schematic diagrams each explaining a bonding method by a ball bonding method.
Figure 1B:
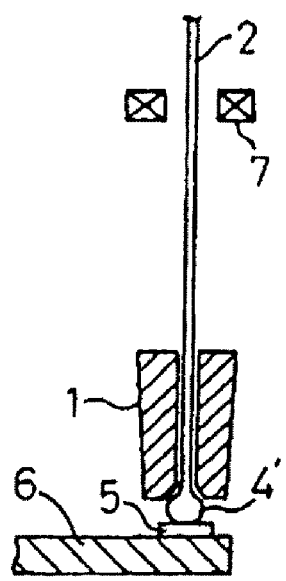
Figure 1C:
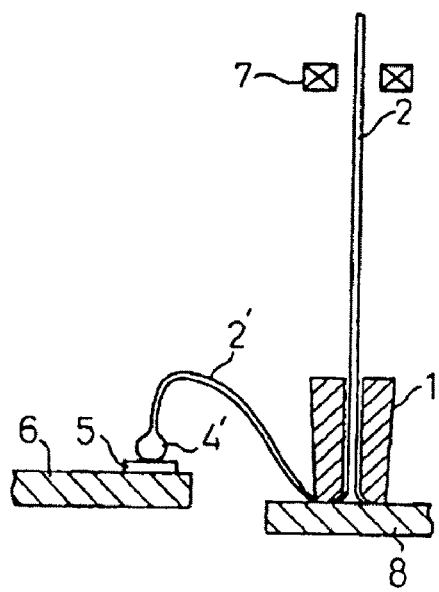
Figure 1D:
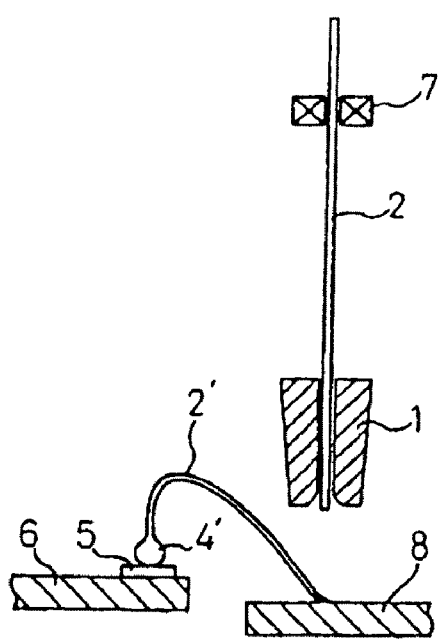
Figure 2A:
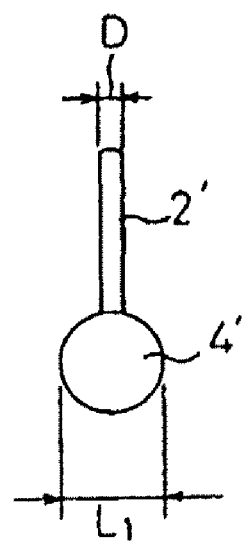
FIGS. 2A and 2B show shapes and sizes of a bonding portion according to a ball bonding method and a stitch bonding method, respectively.
Figure 2B:
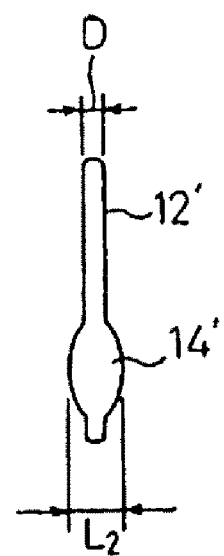

| | |
|---|---|
| 1 | Capillary |
| 2 | Wire |
| 3 | Electric torch |
| 4 | Ball |
| 4' | Compression ball |
| 5 | Al electrode |
| 6 | IC chip |
| 7 | Clamper |
| 8 | External wire |
| D | Wire diameter |
| $L_1$ | Compression ball diameter |
| $L_2$ | Collapse width |

DESCRIPTION OF PREFERRED EMBODIMENTS

In the present invention, types of additional trace elements are few and component ranges thereof are narrow and limited. Collapse of a balance of a compounding ratio of the additional trace elements of the present invention may adversely affect a wire strength, a stitch bondability, a roundness of a compression ball shape, or a molten-ball formability. Thus, a purity of gold (Au) desirably is as high as possible. In an alloy system of the present invention, when a total of the additional trace elements and impurity elements other than the gold is less than 100 ppm by mass, the bonding wire can be displayed as that of high-purity gold having a purity of a minimum of 99.99% by mass, and thus, it is commercially advantageous.

(Stitch Bondability and Wire Strength)

Stitch bonding of a bonding wire is classified into a solid phase bonding. It is known that a phenomenon which favorably influences the solid phase bonding is the deformability for an adhesion portion formation and a strong bounding power at the adhesion portion.

The deformability for the adhesion portion formation means that it is easy to perform an elastic deformation, a plastic deformation, a creep deformation, a deformation by diffusion, etc. This phenomenon also applies to the stitch bonding. In a case of the bonding wire, it is thought that the lower the wire strength, the easier the deformation for an adhesion portion formation. Thus, there is a relationship of a negative correlation between the wire strength and the stitch bondability.

On the other hand, the bounding power at the adhesion portion is attributed to various phenomena such as a chemical bounding power, agglutination, a surface roughness, a surface condition, etc. However, a general gold alloy wire for a ball bonding is intrinsically stronger in bounding power than other metal bonding wires. The reason for this is that a purity of 99% by mass to a minimum of 99.99% by mass of the composition consists of gold, which is hardly oxidized in the atmosphere. Therefore, it is thought that when there is less adverse effect resulting from an additional element or an oxide of the additional element present on a bonding wire surface, a stronger bonding power at the adhesion portion can be obtained.

When the high-purity gold having a purity of a minimum of 99.999% by mass is used to produce a ball bonding gold wire without adding no additional element at all, the wire is soft, and thus, the deformation for the adhesion portion formation is easy, and there is no adverse effect resulting from the additional element or the oxide of the additional element present on the wire surface. As a result, the resultant bonding wire is considered to be most excellent in stitch bondability. However, the bonding wire is required of a plurality of functions at the same time, and for example, unless the bonding wire has a certain wire strength, there arise practical problems such as inferior wire flow at the time of a resin mold and loop formability. As a result, to improve the wire strength, there is a need of using trace additional elements. All the additional trace elements used in the present invention are those not likely inhibiting the stitch bondability with respect to an influence on the bounding power at the adhesion portion even when compared to pure gold.

The use of the additional trace elements of the present invention at a predetermined compounding ratio also provides an effect of improving the wire strength. The oxide of the additional element present on the wire surface presumably results from an annealing process which is carried out after a final drawing process at temperatures on the order of 30% to 60% of a melting point. Carrying out an annealing process under an inert atmosphere or chemically washing the wire surface after the annealing process may decrease the oxide present on the wire surface. However, there is a manufacturing problem in terms of a cost. A method of the present invention is more practical.

(Molten-Ball Formability)

The molten ball is a ball obtained by generating a spark in the atmosphere to melt a tip end of the bonding wire. In some additional elements, it is confirmed that when an addition amount is large, the oxide of the additional element is grown on a ball entire surface or at an interface (called a neck) portion between the ball and the wire. In some cases, the shrinkage hole may be generated on a bottom side of the ball. For a bonding wire performance, the molten-ball formability is important, and the oxide and the shrinkage hole are required to be reduced to as few as possible. When the trace additional elements of the present invention are used at a predetermined compounding ratio, a satisfactory molten-ball formability which can withstand practical use can be obtained.

(Roundness of a Compression Ball Shape)

Because of a high-density packaging of a semiconductor device, an interval and an area of an aluminum electrode on an IC chip are becoming narrower. When bonding on the aluminum electrode of which the interval and the area are narrow, to prevent contact of the adjacent compression balls, the improvement on the roundness of a compression ball shape becomes indispensable. With respect to the roundness of a compression ball shape, an influence of the compounding ratio of the additional element is great, and when the balance of the compounding ratio is collapsed, the deformation when the molten ball is compressed becomes ununiform, and thus, the roundness of a compression ball shape cannot be maintained. Further, similar to the stitch bondability, the roundness of a compression ball shape tends to have a negative correlation with the wire strength. When the trace additional elements of the present invention are used at a predetermined compounding ratio, both the roundness of a compression ball shape and the wire strength which can withstand practical use can be achieved.

[Mg]

In an alloy system of the present invention, magnesium (Mg) is an element most effective in the roundness of a compression ball shape.

In an alloy system of the present invention, magnesium (Mg) is an additional element not so effective in the wire strength.

In an alloy system of the present invention, a minimum of 10 ppm by mass of magnesium (Mg) is needed. The reason for this is that when the amount is less than this, there is no effect in the roundness of a compression ball shape. In an alloy system of the present invention, to stabilize the roundness of a compression ball shape, an addition amount of magnesium (Mg) preferably is a minimum of 15 ppm by mass. On the other hand, in an alloy system of the present invention, when the addition amount of magnesium (Mg) becomes excessive, i.e., exceeds 50 ppm by mass, the molten-ball formability is adversely affected. In an alloy system of the present invention, to obtain a good molten-ball formability, the addition amount of magnesium (Mg) preferably is a maximum of 40 ppm by mass.

[Eu]

In an alloy system of the present invention, europium (Eu) is also an element effective in the wire strength of the bonding wire, but is not so effective as calcium (Ca) described later.

In an alloy system of the present invention, europium (Eu) is an element effective in the roundness of a compression ball shape, but is not so effective as magnesium (Mg).

In an alloy system of the present invention, a minimum of 5 ppm by mass of europium (Eu) is needed. The reason for this is that when the amount is less than this, there is no effect in the wire strength. On the other hand, in an alloy system of the present invention, when an addition amount of europium (Eu) exceeds 20 ppm by mass, the molten-ball formability is adversely affected.

[Ca]

In an alloy system of the present invention, calcium (Ca) is an element most effective in the wire strength of the bonding wire. However, calcium (Ca) is also an element which adversely affects the roundness of a compression ball shape. Therefore, in an alloy system of the present invention, an effective composition range of calcium (Ca) is limited to a very narrow range, i.e., from 2 to 9 ppm by mass. Only within this range, calcium (Ca) can exhibit an effect in the alloy system of the present invention.

The reason for this is that in an alloy system of the present invention, when an addition amount of calcium (Ca) is less than 2 ppm by mass, there is no effect in the wire strength, and when 9 ppm by mass is exceeded, the roundness of a compression ball shape is adversely affected.

[Eu+Ca]

In an alloy system of the present invention, europium (Eu) presumably interacts with calcium (Ca). That is, both europium (Eu) and calcium (Ca) are additional elements effective in the wire strength, and when these additional trace elements are added together, the wire strength is further improved. However, a total additional amount desirably is a maximum of 25 ppm by mass. The reason for this is that when 25 ppm by mass is exceeded, the stitch bondability and the roundness of a compression ball shape are adversely affected.

Further, an additional amount of calcium (Ca) needs to be a maximum of half that of europium (Eu). The reason for this is that although calcium (Ca) is an element most effective in the wire strength but adversely affects the roundness of a compression ball shape.

[Sn]

In an alloy system of the present invention, tin (Sn) is an element which improves the roundness of a compression ball shape, but is not so effective as magnesium (Mg).

In an alloy system of the present invention, tin (Sn) is an element not so effective in the wire strength of the bonding wire.

In an alloy system of the present invention, in order for tin (Sn) to exhibit an effect, the presence of magnesium (Mg) is needed.

In an alloy system of the present invention, in order for tin (Sn) to exhibit an effect, a minimum of 1 ppm by mass of tin (Sn) is needed. The reason for this is that when the amount is less than this, the effect of tin (Sn) is canceled by an improvement effect of the roundness of a compression ball shape by magnesium (Mg), and thus, the additional effect of tin (Sn) does not appear. In an alloy system of the present invention, when tin (Sn) becomes excessive, i.e., exceeds 30 ppm by mass, the molten-ball formability is adversely affected.

(1) Wire Strength

A wire strength of the invention-based gold alloy of which the elongation percentage was adjusted to 4% was evaluated using a measurement method similar to the conventional method. The elongation percentage was evaluated as follows: a gauge point distance was set to 100 mm at a room temperature; the gold alloy wire was tensioned by a tension tester at a tension velocity of 10 mm/minute; and an elongation amount obtained when the gold alloy was fractured was substituted into the following expression:

$$\text{Elongation percentage} = \frac{\text{elongation amount when fractured}}{100(\text{mm})} \times 100(\%) \quad \text{[Expression 1]}$$

The determination procedure is as follows: wires having a diameter of 25 μm were adjusted in elongation percentage by a final thermal process to 4.0%; an average of five measured wires was used as a measurement value; and a sample having a high value was determined as good.

More specifically, the sample having a wire strength of a minimum of 11.5 g (112.7 mN) is determined as "excellent"; that having a wire strength of less than 11.5 g (112.7 mN) to a minimum of 10.0 g (98 mN) is determined as "good"; that having a wire strength of less than 10.0 g (98 mN) to a minimum of 8.5 g (83.3 mN) is determined as "fair"; and that having a wire strength of less than 8.5 g (83.3 mN) is determined as "poor".

(2) Molten-Ball Formability

The molten-ball formability can be easily confirmed by general scanning-electron-microscopic and light-microscopic observations.

In the present invention, the determination procedure was as follows: 10 samples were measured; a sample in which a minimum of 6 of entire contaminations or shrinkage holes resulting from an oxide were confirmed by the scanning-electron-microscopic observation was determined as "poor"; that in which 5 to 2 were confirmed was determined as "fair"; and that in which a maximum of 1 was confirmed was determined as "good".

(3) Stitch Bondability

In the stitch bonding, the bonding wire, while being applied a load or an ultrasonic wave via a capillary, is deformed thereagainst, and is bonded on a frame or a substrate plated by Ag, Au, Pd, etc. With respect to the stitch bondability, similar to the conventional gold alloy, the gold alloy of the present invention can maintain high stitch bondability.

Figure 3:
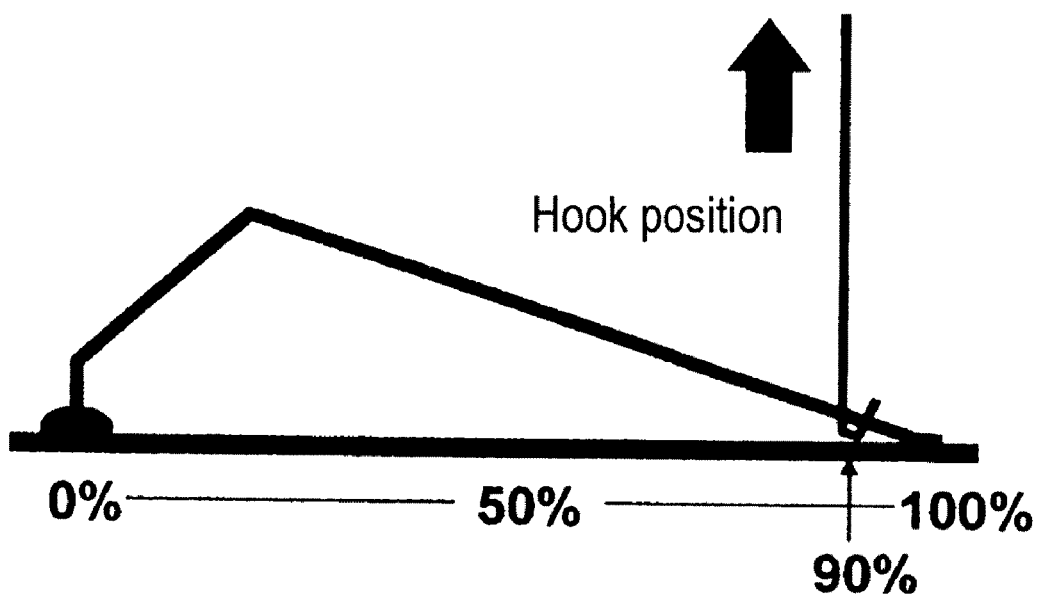
FIG. 3 is a schematic diagram for explaining a bonding strength measurement of a bonding wire.

The measurement method of the present invention is as follows: a lead frame made of 42 alloys plated by silver (Ag) was used; while defining a measurement position so that a central portion of a compression ball was set to 0% and a lead terminal bonding portion was set to 100%, the measurement was performed near a 90%-lead-terminal-bonding portion, as shown in FIG. 3.

The measurement method is as follows: a sample obtained immediately after the bonding was used; an IC chip side and a lead terminal were fixed by a jig; a wire was pulled above; and in this state, a peel strength was measured. In the determination, an average of 30 measured samples was used as a measurement value, and a sample having a high value was determined as good.

More specifically, a sample having a peel strength of a minimum of 7.0 g (68.6 mN) is determined as "excellent"; that having a peel strength of less than 7.0 g (68.6 mN) to a minimum of 5.0 g (49.0 mN) is determined as "good"; that having a peel strength of less than 5.0 g (49.0 mN) to a minimum of 3.0 g (29.4 mN) is determined as "fair"; and that having a peel strength of less than 3.0 g (29.4 mN) is determined as "poor".

(4) Roundness of a Compression Ball Shape

An evaluation of the roundness of a compression ball shape is described below. A ball bonding was performed on an aluminium electrode (aluminium thickness: about $7 \times 10^{-8}$ m) on a silicon chip under a condition that a compression ball diameter reached about 63 μm, a stitch bonding was subsequently performed between a lead made of 42 alloys plated by silver (Ag) and the electrode, and the connection therebetween was performed by a ball bonding method. At this time, a span was $3 \times 10^{-3}$ m, the number of wires was 200, and out of the connected wires, 50 compression balls were arbitrarily used to evaluate the roundness of a compression ball shape. An ultrasonic applying direction, a compression diameter in a parallel direction, and a compression diameter in a vertical direction were measured, and a sample having a low standard deviation evaluated from a total of 50 compression balls was determined as good.

More specifically, a sample having a standard deviation of less than 0.7 μm is determined as "excellent"; that having a standard deviation of a minimum of 0.7 μm to less than 1.0 μm is determined as "good"; that having a standard deviation of a minimum of 1.0 μm to less than 1.5 μm is determined as "fair"; and that having a standard deviation of a minimum of 1.5 μm is determined as "poor".

(5) Manufacturing Method of Gold Alloy Wire

A preferred manufacturing method of the gold alloy wire according to the present invention is described.

Elements of a predetermined amount are added to high-purity gold, and the resultant mixture is melted in a vacuum fusion furnace for casting. The cast ingot undergoes rolling working using a groove roll rolling mill, and cold working and intermediate anneal using a wire drawer. Final drawing processing is then applied to the resultant ingot to obtain a thin wire having a diameter of 25 μm, and thereafter, a final anneal is performed to adjust an elongation percentage to 4%.

In a case of an alloy composition according to the present invention, there is a temperature range in which when a temperature of the final anneal is rising, the elongation percentage of 4% is maintained and the tension strength gradually decreases. Even in the same composition, depending on a magnitude of a final drawing processing rate, the tension strength differs. Thus, the final drawing processing rate and the final anneal temperature are controlled to adjust the elongation percentage and the tension strength. In this way, the elongation percentage of 4% was maintained.

Effects

In a gold wire having a purity of a minimum of 99.999% by mass, the wire strength is low and a decrease in wire strength over time can also be observed. Thus, in the gold alloy wire used as the bonding wire, a predetermined amount of additional elements is added to increase the wire strength than that of the gold wire having a purity of a minimum of 99.999% by mass. A majority of bonding wires commercially available are added with beryllium (Be), calcium (Ca), and several rare-earth elements. These additional elements have a wire strength improvement effect.

On the other hand, with respect to the stitch bondability required for the bonding wire, when the wire strength becomes stronger, the deformation for the above-described adhesion portion formation becomes difficult, and when the additional elements added for increasing the wire strength increase, a bounding power at the adhesion portion decreases, and thus, the stitch bondability is deteriorated. In the present invention, according to types of the additional elements, several additional elements which improve the wire strength but have little adversely affect on the bounding power at the adhesion portion and less likelihood of deteriorating the stitch bondability are specified, and as a result, it was found that calcium (Ca) and europium (Eu) were the most appropriate additional elements.

However, for the general bonding wire, besides the wire strength and the stitch bondability, the roundness of a compression ball shape is also required. However, it has been known that generally, when the wire strength increases, the roundness of a compression ball shape becomes difficult to be secured. Therefore, to secure the roundness of a compression ball shape, the gold alloy system of the present invention uses magnesium (Mg) which affects the wire strength only a little. With respect to calcium (Ca) excellent in wire strength and stitch bondability, it was identified that even in a case of the alloy system using magnesium (Mg), when magnesium (Mg) is used without taking into consideration an addition amount or an interaction with another additional element which improves the wire strength, the roundness of a compression ball shape cannot be improved.

Therefore, calcium (Ca) in the gold alloy system of the present invention was compounded taking into consideration the addition amount and the interaction with the other additional element which improves the wire strength. As a result, focusing a compounding ratio between calcium (Ca) and europium (Eu), is achieved the improvement in both the stitch bondability and the wire strength while maintaining the effect of improving the roundness of a compression ball shape.

More specifically, in an alloy system of the present invention, compared to europium (Eu), calcium (Ca) has a stronger effect in wire strength of the bonding wire. Therefore, in order that an influence of calcium (Ca) on the wire strength of the bonding wire is rendered secondary and that of europium (Eu) is rendered primary, the addition amount of calcium (Ca) is set to a maximum of half that of europium (Eu).

EXAMPLES

Hereinafter, with reference to Table 1, examples and comparative examples are described.

High-purity gold having a purity of 99.999% by mass was added with a predetermined amount of additional elements in a trace amount, the resultant mixture was melted in a vacuum fusion furnace, and then cast. Thereby, gold alloy ingots having compositions listed on the left column of Table 1 were obtained. The ingots underwent rolling working using a groove roll rolling mill, and cold working and intermediate anneal using a wire drawer. Final drawing processing was then applied to the resultant ingots to obtain thin wires having a diameter of 25 μm, and thereafter, a final anneal was performed to adjust an elongation percentage to 4%.

Figure 4:
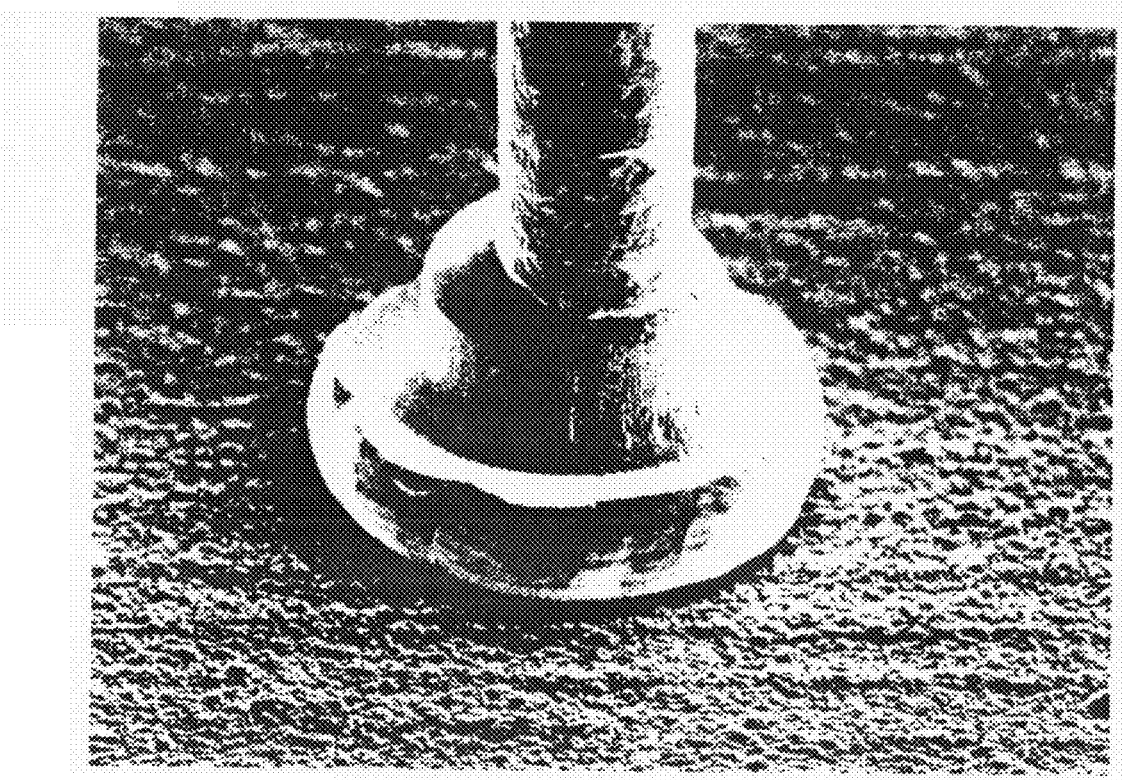
FIG. 4 is a photograph showing an example of a ball bonding by a gold alloy wire for a ball bonding of the present invention.
Figure 5:
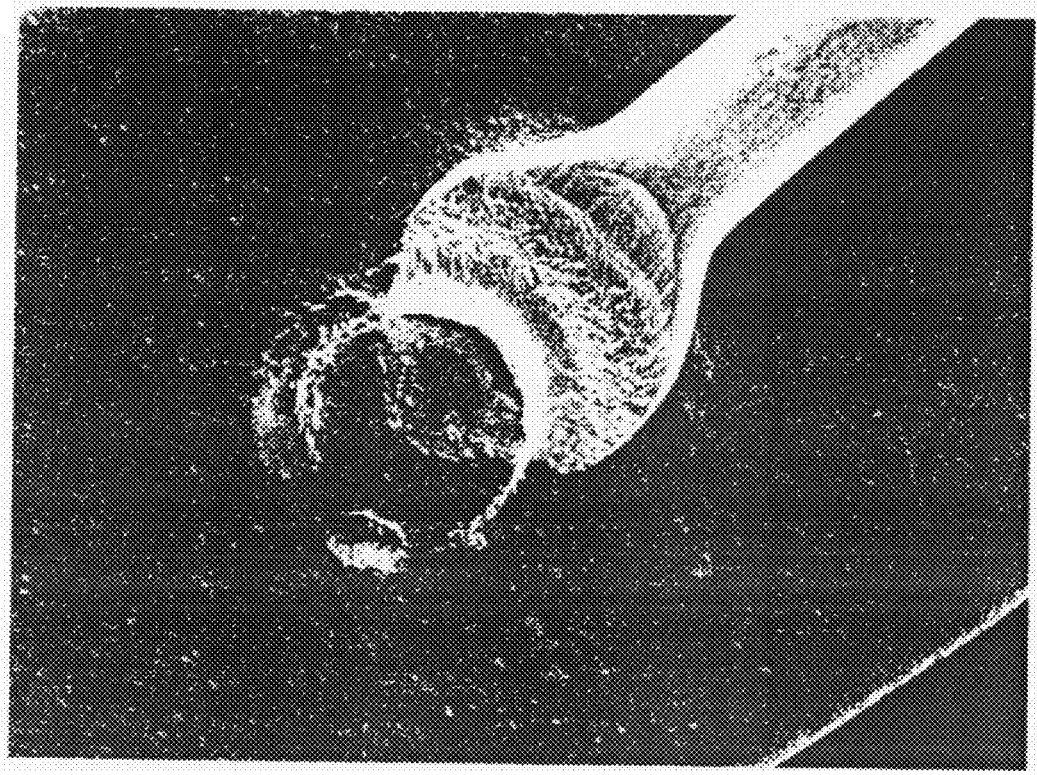
FIG. 5 is a photograph showing an example of a stitch bonding by the gold alloy wire for a ball bonding of the present invention.

The Gold alloy wires were bonded to a ball compressed on an aluminium electrode of an IC chip by using a ball bonding device (UTC1000-type, manufactured by SHINKAWA LTD.), and in this state, a stitch bonding is applied to a silver-plated lead terminal. A photograph of one example of the ball compression is shown in FIG. 4, and that of an example of the stitch bonding is shown in FIG. 5.

Bonding conditions on an IC chip side at this time were: a load of 30 g; a bonding time of 12 milliseconds; and an ultrasonic wave output of 300 mW. On the other hand, bonding conditions on a lead terminal side were: a load of 40 g; a bonding time of 10 milliseconds; and an ultrasonic wave output of 400 mW. A common bonding condition, i.e., a bonding temperature, was 200° C. A capillary used was that manufactured by SPT Japan K.K., SBNS-33CD-AZM-1/16-XL.

Subsequently, by using samples immediately after the bonding, the roundness of a compression ball shape was measured from above the aluminium electrode and the stitch bondability was measured from a wire peel strength near the lead terminal. Respective measurement results are shown in the right column of Table 1.

TABLE 1

Gold alloy composition and performance table of examples and comparative examples

| Element (content unit) | Au (% by mass) | Mg (ppm by mass) | Eu (ppm by mass) | Ca (ppm by mass) | Sn (ppm by mass) | FAB shape (molten-ball Formability) | roundness of a compresson ball shape | stitch bondability | wire strength |
|---|---|---|---|---|---|---|---|---|---|
| Example 01 | Remaining portion | 33 | 14 | 5 |  | good | excellent | good | good |
| Example 02 | Remaining portion | 26 | 17 | 6 |  | good | good | good | good |
| Example 03 | Remaining portion | 14 | 13 | 6 |  | good | fair | good | good |
| Example 04 | Remaining portion | 47 | 18 | 6 |  | good | excellent | good | good |
| Example 05 | Remaining portion | 45 | 11 | 4 |  | fair | excellent | good | good |
| Example 06 | Remaining portion | 12 | 7 | 3 |  | good | fair | excellent | fair |
| Example 07 | Remaining portion | 43 | 15 | 3 |  | good | excellent | excellent | fair |
| Example 08 | Remaining portion | 13 | 18 | 3 |  | good | good | excellent | fair |
| Example 09 | Remaining portion | 28 | 13 | 4 | 3 | good | good | good | good |
| Example 10 | Remaining portion | 37 | 15 | 7 | 11 | good | good | good | good |
| Example 11 | Remaining portion | 19 | 9 | 3 | 20 | good | good | excellent | fair |

TABLE 1-continued

Gold alloy composition and performance table of examples and comparative examples

| Element (content unit) | Au (% by mass) | Gold alloy component composition | | | | | Performance evaluation of examples and comparative examples | | | |
|---|---|---|---|---|---|---|---|---|---|---|
| | | Mg (ppm by mass) | Eu (ppm by mass) | Ca (ppm by mass) | Sn (ppm by mass) | FAB shape (molten-ball Formability) | roundness of a compresson ball shape | stitch bondability | wire strength |
| Example 12 | Remaining portion | 35 | 17 | 8 | 15 | fair | excellent | good | good |
| Comparative Example 01 | Remaining portion | 25 | 10 | 25 | | fair | poor | poor | excellent |
| Comparative Example 02 | Remaining portion | 29 | 8 | 10 | | good | poor | fair | good |
| Comparative Example 03 | Remaining portion | 35 | 19 | 15 | | good | poor | poor | excellent |
| Comparative Example 04 | Remaining portion | 53 | 3 | 1 | | poor | good | excellent | poor |
| Comparative Example 05 | Remaining portion | 8 | 22 | 8 | 32 | poor | fair | good | good |

The following can be understood from the measurement results:

(1) With respect to examples 1 to 12, when observed with a scanning electron microscope, not so much entire contamination or shrinkage holes resulting from an oxide were found, and the molten-ball formability withstood practical use, and hence, satisfactory. In contrary thereto, in a comparative example 4 in which an addition amount of magnesium (Mg) exceeded an upper limit value, and a comparative example 5 in which an addition amount of tin (Sn) exceeded an upper limit value, the scanning-electron-microscopic observation detected many entire contaminations or shrinkage holes resulting from an oxide, and thus, the molten-ball formability did not withstand practical use, and hence, was unsatisfactory.

(2) In all the examples 1 to 12, the roundness of a compression ball shape withstood practical use, and hence, was satisfactory. In contrary thereto, in a comparative example 1 and in a comparative example 2 in which an addition amount of calcium (Ca) exceeded an upper limit value (in the comparative example 1, a total of addition amounts of europium (Eu) and calcium (Ca) also exceeded an upper limit value of 25 ppm by mass), the roundness of a compression ball shape when the molten ball was compressed did not withstand practical use, and hence, was unsatisfactory. Further, also in a comparative example 3 in which an addition amount of calcium (Ca) did not reach a maximum of half that of europium (Eu) (in the comparative example 3, also a total of addition amounts of europium (Eu) and calcium (Ca) exceeded an upper limit value of 25 ppm by mass), the roundness of a compression ball shape did not withstand practical use, and hence, was unsatisfactory.

(3) In all the examples 1 to 12, the stitch bondability was stabled, and as a result, the samples all withstood practical use, and hence, were satisfactory. In contrary thereto, in a comparative example 4 in which addition amounts of calcium (Ca) and europium (Eu) did not satisfy a lower limit value, the stitch bondability was stabled but the wire strength was not sufficient, and thus, the comparative example 4 did not withstand practical use, and hence, was unsatisfactory. In the comparative example 1 and the comparative example 3 in which the addition amount of calcium (Ca) exceeded an upper limit value, the wire strength was satisfactory but the stitch bondability was not sufficient, and thus, these comparative examples did not withstand practical use, and hence, were unsatisfactory.

INDUSTRIAL APPLICABILITY

According to the gold alloy wire for a ball bonding of the present invention, the Au alloy consisting of an additional trace element system of a predetermined range of Ca—Mg—Eu or the gold alloy consisting of an additional trace element system of Ca—Mg—Eu—Sn can exhibit an effect excellent in roundness of a compression ball shape, is effective in improving molten-ball formability, stitch bondability, wire strength, and the reliability of a semiconductor device, similar to the conventional case, and is of very much industrial practical value.

What is claimed is:

1. A gold alloy wire for a ball bonding, the gold alloy consisting of:
   10 to 50 ppm by mass of magnesium (Mg);
   5 to 20 ppm by mass of europium (Eu);
   2 to 9 ppm by mass of calcium (Ca); and
   a remaining portion being gold (Au) having a purity of a minimum of 99.998% by mass, wherein
   the amount of calcium (Ca) is a maximum of half that of europium (Eu).

2. A gold alloy wire for a ball bonding, the gold alloy consisting of:
   10 to 50 ppm by mass of magnesium (Mg);
   1 to 30 ppm by mass of tin (Sn);
   5 to 20 ppm by mass of europium (Eu);
   2 to 9 ppm by mass of calcium (Ca); and
   a remaining portion being gold (Au) having a purity of a minimum of 99.998% by mass, wherein
   the amount of calcium (Ca) is a maximum of half that of europium (Eu).

3. A gold alloy wire for a ball bonding, the gold alloy consisting of:
   10 to 50 ppm by mass of magnesium (Mg);
   5 to 20 ppm by mass of europium (Eu);
   2 to 9 ppm by mass of calcium (Ca); and
   a remaining portion being gold (Au) having a purity of a minimum of 99.998% by mass, wherein a weight of calcium (Ca) is a maximum of half that of europium (Eu), and a total amount of europium (Eu) and calcium (Ca) is a maximum of 25 ppm by mass.

4. A gold alloy wire for a ball bonding, the gold alloy consisting of:

10 to 50 ppm by mass of magnesium (Mg);
1 to 30 ppm by mass of tin (Sn);
5 to 20 ppm by mass of europium (Eu);
2 to 9 ppm by mass of calcium (Ca); and
a remaining portion being gold (Au) having a purity of a minimum of 99.998% by mass, wherein
the amount of calcium (Ca) is a maximum of half that of europium (Eu), and a total addition amount of europium (Eu) and calcium (Ca) is a maximum of 25 ppm by mass.

5. The gold alloy wire for a ball bonding according to claim 1, wherein magnesium (Mg) is 15 to 40 ppm by mass.

6. The gold allow wire for a ball bonding according to claim 2, wherein the magnesium (Mg) is 15 to 40 ppm by mass.

7. The gold allow wire for a ball bonding according to claim 3, wherein the magnesium (Mg) is 15 to 40 ppm by mass.

8. The gold allow wire for a ball bonding according to claim 4, wherein the magnesium (Mg) is 15 to 40 ppm by mass.

* * * * *